(12) United States Patent
Kuo et al.

(10) Patent No.: US 8,254,146 B2
(45) Date of Patent: Aug. 28, 2012

(54) DETACHABLE CAPACITOR DEVICE

(75) Inventors: Chung-Wei Kuo, Taipei (TW);
Chien-Jung Wu, Taipei (TW);
Ming-Chuan Lee, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 332 days.

(21) Appl. No.: 12/684,977

(22) Filed: Jan. 11, 2010

(65) Prior Publication Data
US 2010/0214758 A1 Aug. 26, 2010

(30) Foreign Application Priority Data

Feb. 26, 2009 (TW) .............................. 98106140 A (51) Int. Cl.
*H05K 7/02* (2006.01)
(52) U.S. Cl. ........ 361/811; 361/278; 361/300; 361/513; 439/639; 439/644; 29/839; 29/843
(58) Field of Classification Search .................. 361/811, 361/278, 300, 513; 439/639, 644; 29/839, 29/843
See application file for complete search history.

(56) References Cited

U.S. PATENT DOCUMENTS

| | | | | |
|---|---|---|---|---|
| 4,101,951 A | * | 7/1978 | Kuze | 361/293 |
| 4,292,660 A | * | 9/1981 | Tatsumi | 361/293 |
| 4,584,630 A | * | 4/1986 | Rubin | 361/513 |
| 5,060,109 A | * | 10/1991 | Armistead et al. | 361/294 |
| 5,659,953 A | * | 8/1997 | Crane et al. | 29/843 |
| 5,839,189 A | * | 11/1998 | Pomeroy et al. | 29/839 |
| 5,989,070 A | * | 11/1999 | Al-Turki | 439/644 |
| 6,113,433 A | * | 9/2000 | Al-Turki | 439/639 |

FOREIGN PATENT DOCUMENTS

| | | |
|---|---|---|
| CN | 2450764 | 9/2001 |
| CN | 2627631 Y | 7/2004 |
| CN | 1897182 | 1/2007 |
| JP | 4137689 | 5/1992 |
| JP | 07-45346 A | 2/1995 |
| JP | 200135745 | 2/2001 |

* cited by examiner

*Primary Examiner* — Xiaoliang Chen
(74) *Attorney, Agent, or Firm* — CKC & Partners Co., Ltd.

(57) ABSTRACT

A capacitor seat and two conductors are utilized to install a capacitor seat on a PCB by soldering the two conductors on electrical contacts of the PCB. The capacitor is installed on the capacitor seat in a fastening way such as by pressing downward, rotating the capacitor or in other feasible fastening ways to be electrically connected with the electrical contacts on the PCB. If the detachable capacitor device has errors or is damaged in use, or a user wants to replace it with a different type of the capacitors to test or adjust the characteristic of the circuit, it is easy to replace the capacitor.

11 Claims, 7 Drawing Sheets

DETACHABLE CAPACITOR DEVICE

BACKGROUND OF THE INVENTION

1. Field of the Invention

The invention relates to a capacitor device and, more particularly, to a detachable capacitor device.

2. Description of the Related Art

A capacitor of the circuit is an important component for stabling a system. A conventional capacitor device has two thin and long metal leads outside a body of the capacitor, and the capacitor device is soldered on a PCB via the electric soldering or surface mounting technology (SMT). As requirements for a motherboard and various kinds of electronic components on high-efficiency electronic devices such as a computer become higher and higher, it becomes more and more popular to use multiple groups of capacitor devices to stable electronic components, chips, or a signal and a current of a circuit. More capacitor devices means higher capacitor failure rate. However, to a damaged capacitor, replacing the capacitor is very troublesome. In a conventional method, a soldering gun should be used to replace an old capacitor with a new one. Additionally, positive and negative polarities of the leads of the capacitor need to be marked on a surface packaging of a conventional capacitor device, and when the capacitor is soldered on the PCB, the positive and negative polarities should not be reversed.

Figure 1:
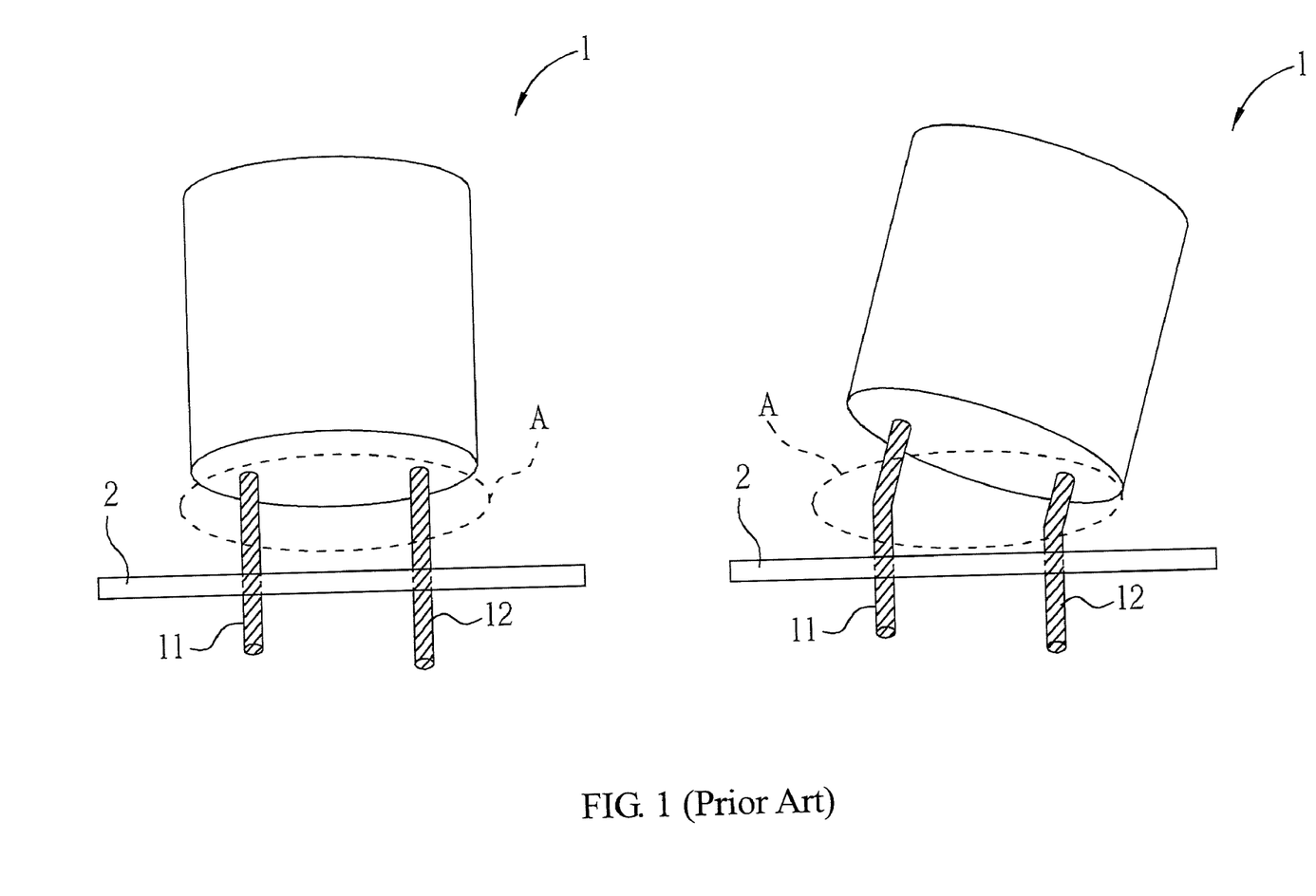
FIG. 1 is a schematic diagram showing that a conventional capacitor device installed on a PCB.

FIG. 1 is a schematic diagram showing that a conventional capacitor device 1 installed on a PCB 2. Since metal leads 11 and 12 of the capacitor device 1 are thin and long, the leads 11 and 12 of the capacitor device 1 may not totally pass through the PCB 2 and leave small sections A of the leads when they are soldered on the PCB 2. When the user touches the capacitor device 1 by mistake, the capacitor device 1 may be un-firm and lean due to the small sections A of the leads (as shown in the right part of FIG. 1), or even the capacitor is damaged due to the break of the lead of the capacitor device 1.

BRIEF SUMMARY OF THE INVENTION

The invention provides a capacitor device, and when a user replaces a capacitor, he or she may directly detach a capacitor from a capacitor seat to easily replace the capacitor.

The invention provides a capacitor device whose positive and negative leads of the capacitor are processed to be foolproof, and thus the user can easily, quickly, and safely replace the capacitor.

The invention provides a detachable capacitor device used for being installed on a printed circuit board (PCB). The detachable capacitor device includes a capacitor, a capacitor seat, and two conductors. The capacitor has a first lead and a second lead. The capacitor seat has a first recess and a second recess. The two conductors are disposed in the first recess and the second recess and electrically connected with electrical contacts of the PCB, respectively. The capacitor is detachably installed on the capacitor seat, and when the capacitor is installed at the capacitor seat, the first lead and the second lead are extended in the first recess and the second recess, respectively, and contact the two conductors to be electrically connected with the electrical contacts of the PCB.

The invention further provides a detachable capacitor device, used for being installing on a PCB. The detachable capacitor device includes a capacitor and a capacitor seat. The capacitor has a first lead and a second lead, the capacitor seat has the two conductors electrically connected with electrical contacts of the PCB, respectively. The capacitor is detachably installed on the capacitor seat. When the capacitor is installed at the capacitor seat, the first lead and the second lead contact the two conductors to be electrically connected with the electrical contacts of the PCB.

These and other features, aspects and advantages of the present invention will become better understood with regard to the following description, appended claims, and accompanying drawings.

DETAILED DESCRIPTION OF THE EMBODIMENTS

Figure 2:
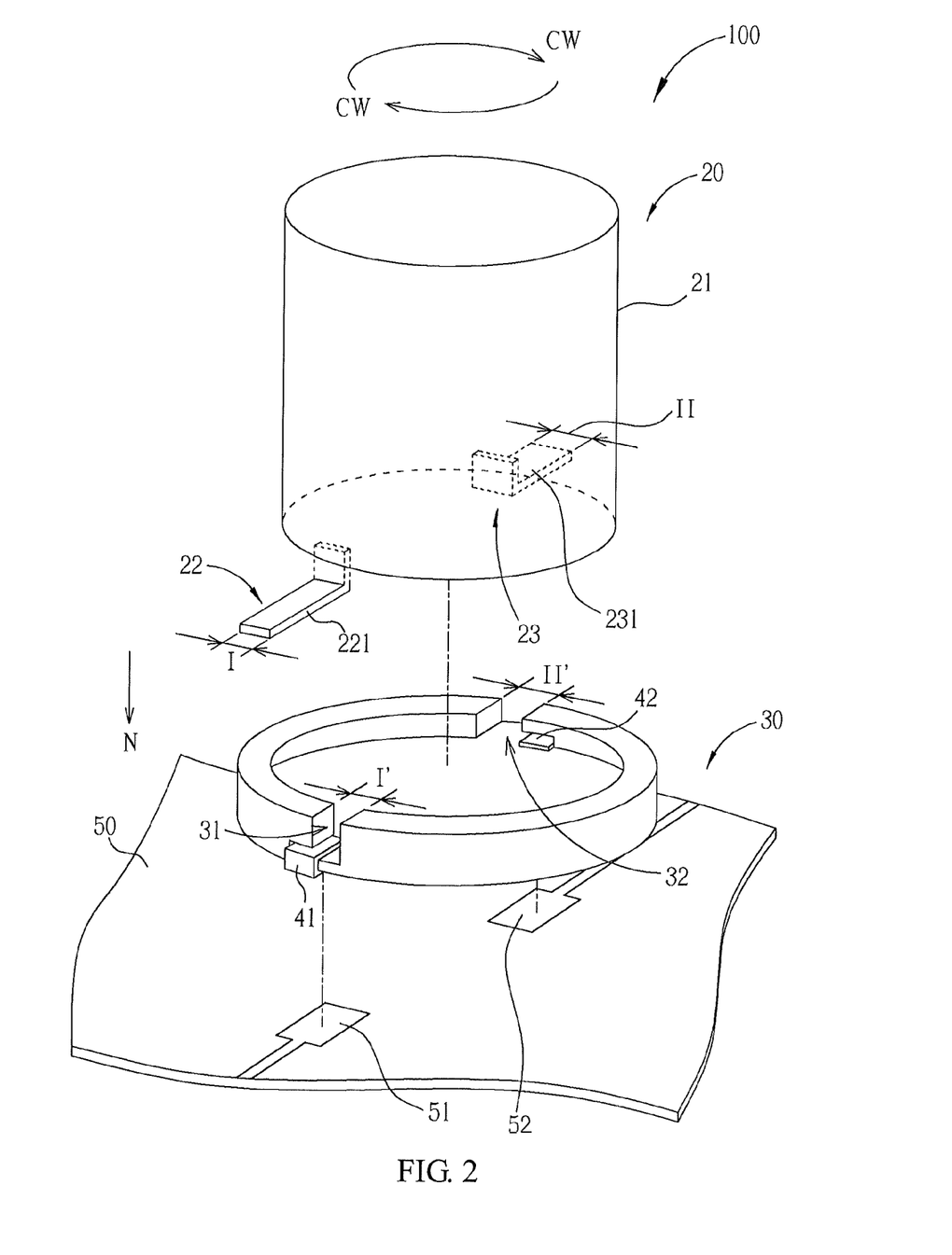
FIG. 2 is a schematic diagram showing a capacitor and a capacitor seat of a detachable capacitor device according to an embodiment of the invention.

FIG. 2 is a schematic diagram showing a capacitor 20 and a capacitor seat 30 of a detachable capacitor device 100 according to an embodiment of the invention. The capacitor device 100 includes the capacitor 20, the capacitor seat 30, and two conductors 41 and 42. The capacitor seat 30 is soldered to a PCB 50 via the conductors 41 and 42.

The capacitor 20 includes a capacitor body 21, a first lead 22, and a second lead 23. In this embodiment, the first lead 22 and the second lead 23 are flat leads, and they have a turning portion 221 and a turning portion 231, respectively. The width of the turning portion 221 is I, the width of the turning portion 231 is II, and the width I and the width II are different. The capacitor seat 30 has a first recess 31 and a second recess 32. In this embodiment, the first recess 31 and the second recess 32 are L-shaped.

Figure 3:
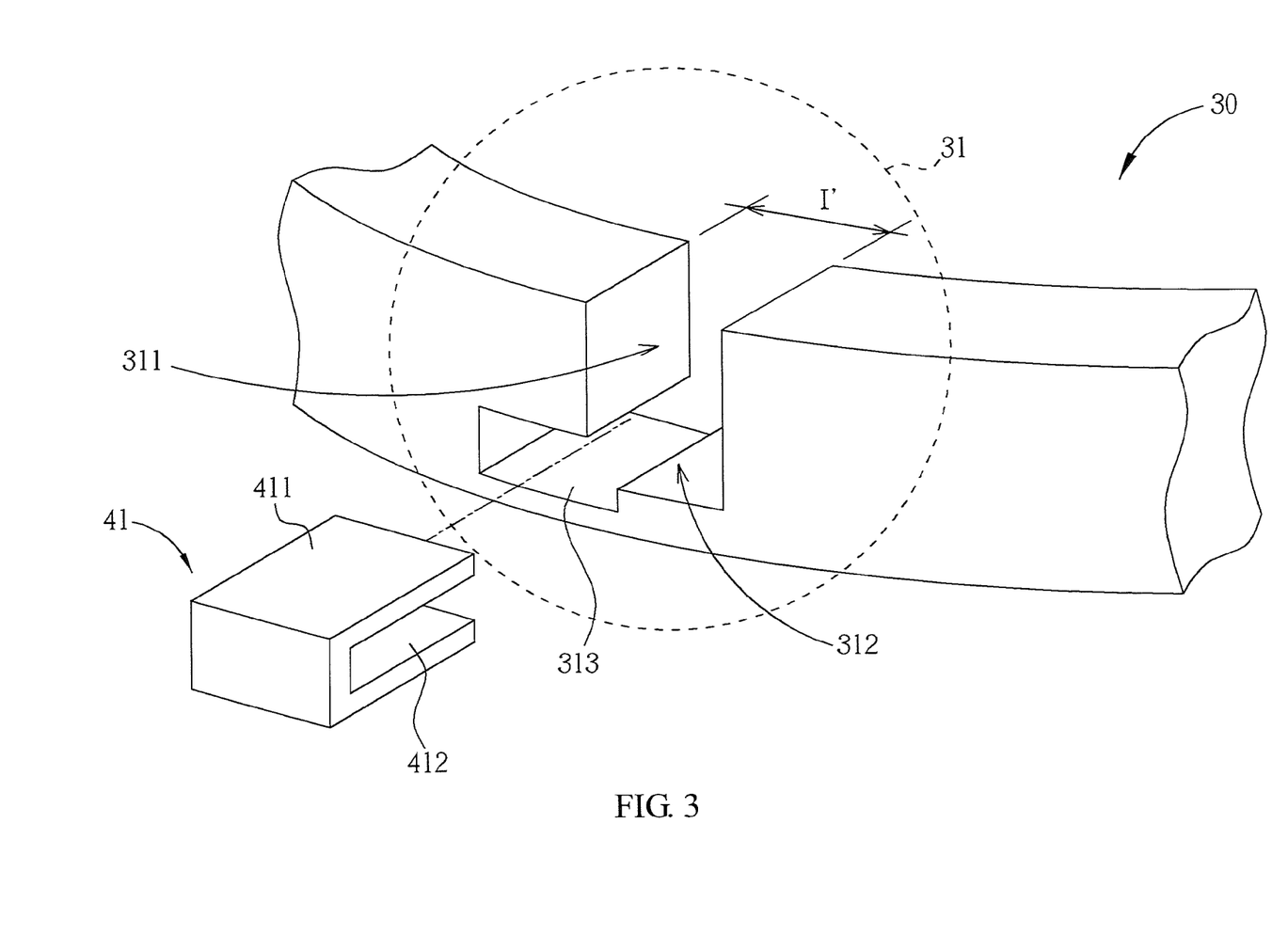
FIG. 3 is a schematic diagram showing that conductors are installed in a recess of the capacitor seat.

FIG. 3 is a schematic diagram showing that the conductor 41 is installed in the first recess 31 of the capacitor seat 30. The first recess 31 has a vertical portion 311 and a horizontal portion 312 therein, and the vertical portion 311 and the horizontal portion 312 form an L shape. The width of an opening of the vertical portion 311 is I', which is approximately the same as the width I of the turning portion 221 of the first lead 22 of the capacitor 20 (or a little bigger than the width I) to allow the turning portion 221 to pass through the vertical portion 311 to reach the horizontal portion 312. In this embodiment, the conductor 41 is a U-shaped metal sheet including a first end 411 and a second end 412. The conductor 41 is held at the horizontal portion 312 of the first recess 31 to be disposed in the first recess 31 via the U-shaped opening to make the first end 411 exposed from the horizontal portion 312 and the second end 412 exposed from the bottom of the capacitor seat 30. The second end 412 exposed from the bottom of the capacitor seat 30 are electrically connected with the electrical contacts 51 of the PCB 50.

Additionally, in this embodiment, the horizontal portion 312 of the first recess 31 further has a recessed portion 313. When the conductor 41 is disposed in the horizontal portion 312, the conductor 41 may be held in the recessed portion 313 to effectively fix the conductor 41. The conductor 42 and the second recess 32 are similar to the conductor 41 and the first recess 31, which are not described herein for a concise purpose. The difference between the second recess 32 and the first recess 31 is that the width of a vertical portion of the second recess 32 is II' and approximately the same as the width II of the turning portion 231 of the second lead 23 of the capacitor 20 (or a little bigger than the width II) to make the turning portion 231 to pass through the vertical portion of the second recess 32 to reach the horizontal portion of the second recess 32.

In FIG. 2, the capacitor 20 may be inserted in the vertical portions of the recesses 31 and 32 along a N direction with the two leads 22 and 23 aligned with the recesses 31 and 32 of the capacitor seat 30, respectively, and then it is rotated along a CW direction to make the turning portions 221 and 231 of the two leads 22 and 23 contact the conductors 41 and 42, respectively. Furthermore, the conductors 41 and 42 are soldered on the electrical contacts 51 and 52 of the PCB 50, respectively. Consequently, when the capacitor 20 is installed on the capacitor seat 30, the capacitor 20 is electrically connected with the electrical contacts 51 and 52 on the PCB 50 to act. In this embodiment, the widths of the first lead 22 and the second lead 23 of the capacitor 20 are appropriately equal to those of the first recess 31 and the second recess 32 of the capacitor seat 30, respectively, and the width of the first lead 22 and the second lead 23 are different. In FIG. 2, the width II of the turning portion 231 of the second lead 23 is bigger than the width I of the turning portion 221 of the first lead 22 (the width of the first recess 31 is smaller than that of the second recess 32). That is, the width I' of the vertical portion 311 of the first recess 31 is smaller (smaller than the width II of the turning portion 231 of the second lead 23). As a result, to install the capacitor 20 at the capacitor seat 30, the capacitor 20 can be installed only along a single direction. That is, the capacitor 20 is installed with the first lead 22 corresponding with the first recess 31 and the second lead 23 corresponding with the second recess 32, and thus the capacitor device 100 according to the invention has a fool-proof function.

Figure 4:
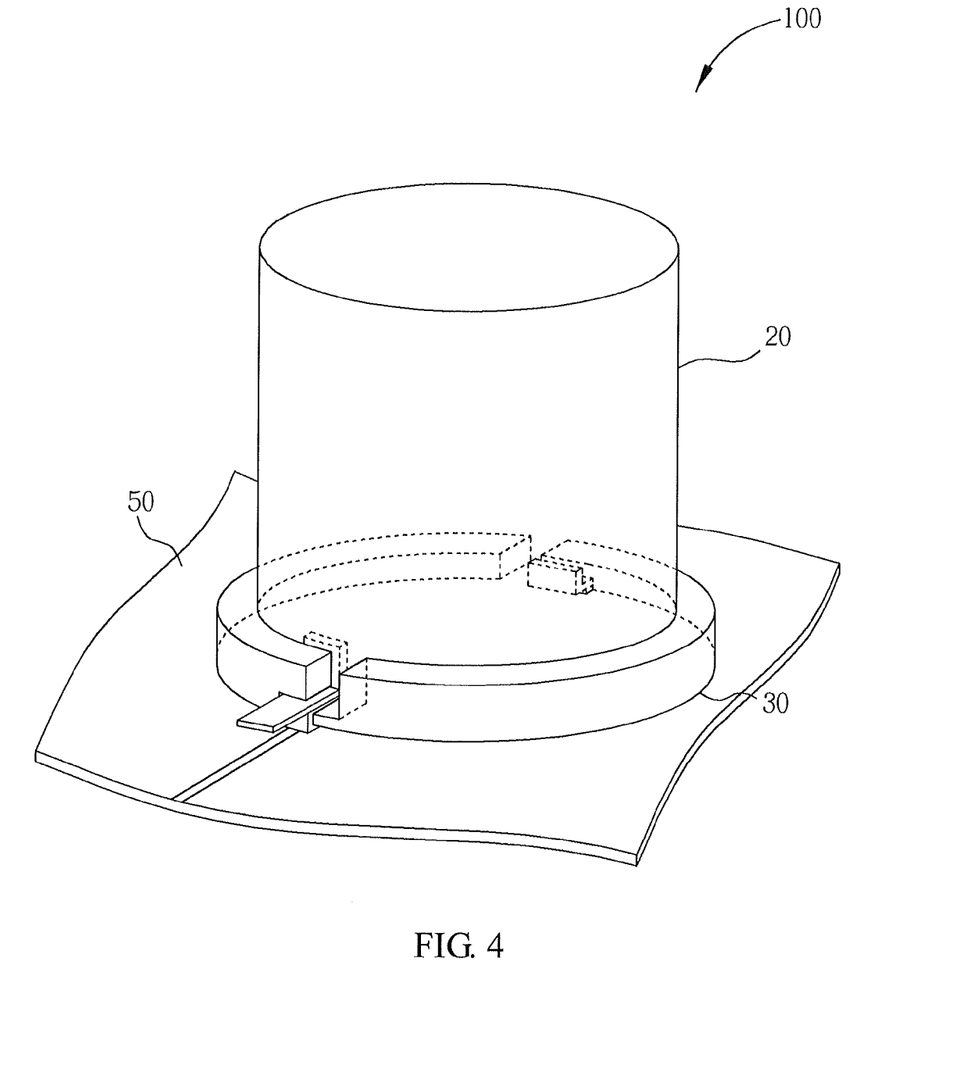
FIG. 4 is a schematic diagram showing that the capacitor in FIG. 2 is installed on the capacitor seat.

FIG. 4 is a schematic diagram showing that the capacitor 20 is installed on the capacitor seat 30 to be electrically connected with the electrical contacts 51 and 52 on the PCB 50. As shown in FIG. 2 to FIG. 4, when the capacitor 20 is installed on the capacitor seat 30, the turning portions 221 and 231 of the first lead 22 and the second lead 23 are in the horizontal portions of the first recess 31 and the second recess 32 to contact the conductors 41 and 42, respectively. The heights of the horizontal portions may be appropriately equal to or smaller than the thickness of the turning portions 221 and 231. When the capacitor 20 is rotated along the CW direction, the turning portions 221 and 231 tightly fit the capacitor seat 30 and the conductors 41 and 42 in the horizontal portions to prevent the capacitor 20 loosing from the capacitor seat 30, and thus the firmness is improved.

Since the capacitor 20 is installed on the capacitor seat 30 by pressing downward, rotating, and tightly fitting the conductors 41 and 42, the capacitor 20 may be easily detached from the capacitor seat 30 by operating along a reverse direction. When the capacitor device 100 according to the invention has errors or is damaged in using, or a user wants to replace the capacitor with a different type of the capacitor 20 to test or adjust the characteristic of the circuit, the user may easily detach the capacitor 20 from the capacitor seat 30 to replace it with another capacitor 20 without utilizing complicated ways such as utilizing a soldering gun. When the capacitor 20 is rotated to be installed on the capacitor seat 30 in a tight fit mode, surrounding walls of the capacitor seat 30 may provide more firmness protection to the capacitor 20.

Therefore, the capacitor 20 does not lean in use due to a mis-touch of the user, and errors which occur when the capacitor does not contact with the conductors 41 and 42 are avoided.

Figure 5:
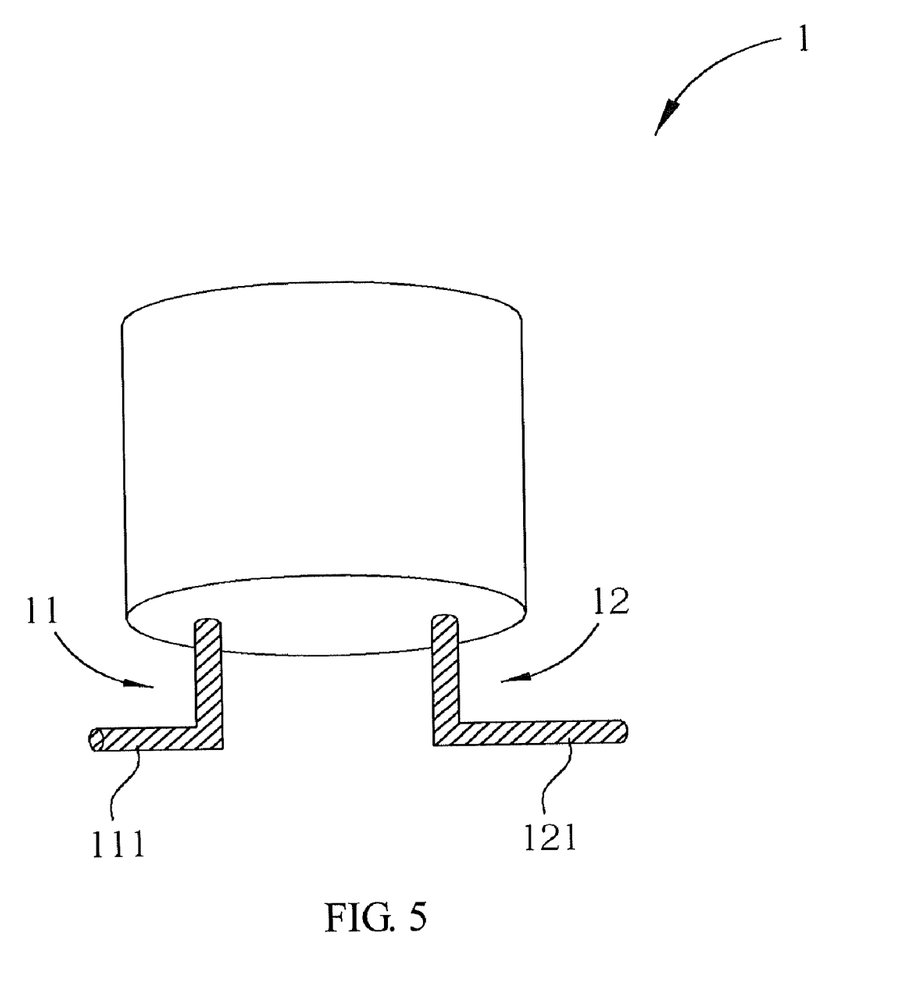
FIG. 5 is a schematic diagram showing a capacitor according to another embodiment of the invention.

Additionally, the first recess 31 and the second recess 32 in the capacitor seat 30 according to the invention are not limited to be L-shaped. That is, the vertical portion and the horizontal portion illustrated above are just an embodiment of the invention, the recesses 31 and 32 also may be other bending recesses but not vertical or horizontal ones, and they also may allow the capacitor 20 to be installed on the capacitor seat 30 by pressing downward and rotating. The shape of the conductors 41 and 42 and the way of disposing the conductors 41 and 42 in the recesses 31 and 32 are not limited to the above embodiment. The capacitor device 100 is not limited to use the capacitor 20 with the flat leads having different widths. In FIG. 5, a capacitor 1 with needle-shaped leads 11 and 12 also may be used in the invention. The positive and negative polarities of the leads of the capacitor 1 are differentiated according to the different lengths of the needle-shaped leads 11 and 12 of the capacitor 1 (or a mark on the capacitor body). When the user installs the capacitor 1 on the capacitor seat 30, he or she may bend the leads 11 and 12 to form the turning portions 111 and 121, and then he or she installs the capacitor 1 on the capacitor seat 30 correspondingly to the polarities of the conductors in the recesses of the capacitor seat 30 in the way as stated in the above embodiment, and the capacitor according to this embodiment also has the characteristic of quick detachment.

Figure 6:
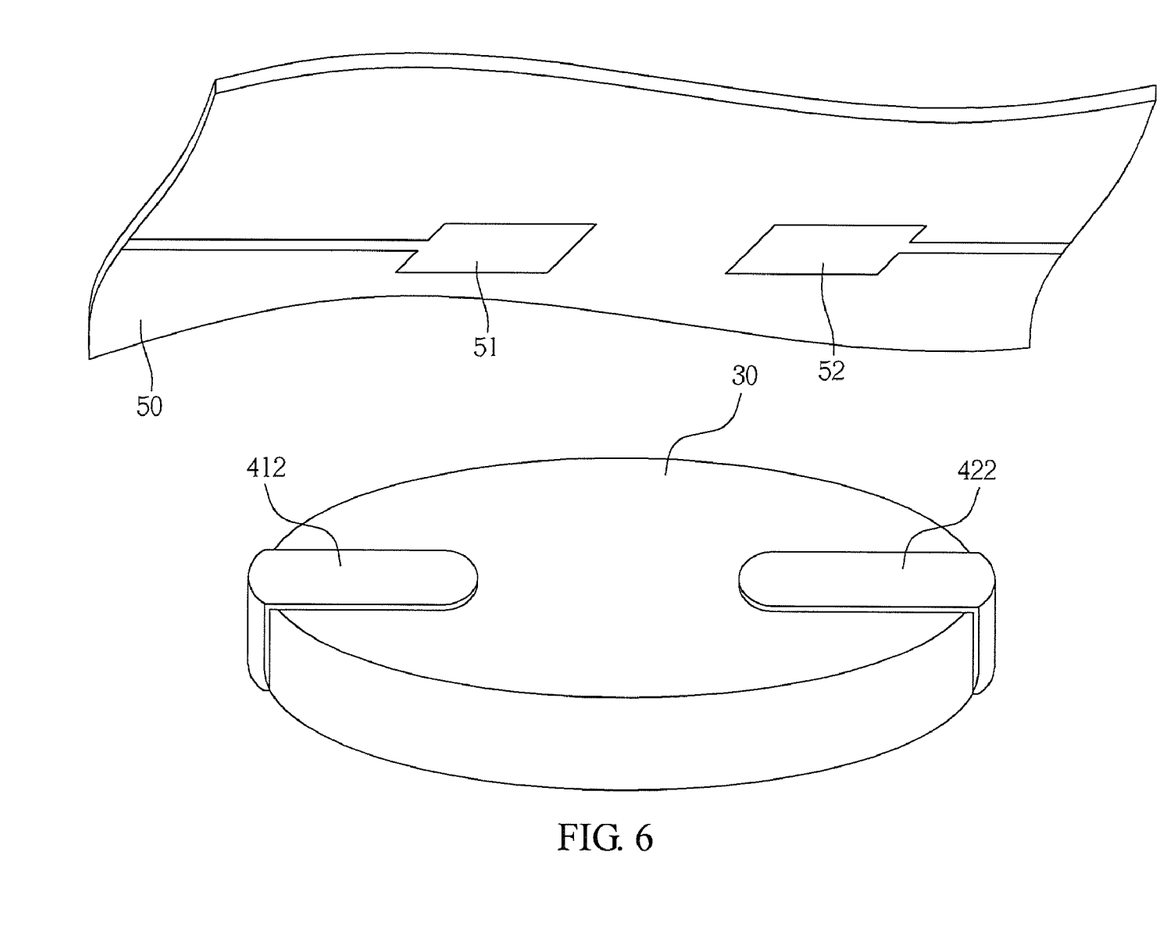
FIG. 6 is a schematic diagram showing a seat of a capacitor according to a first embodiment of the invention.
Figure 7:
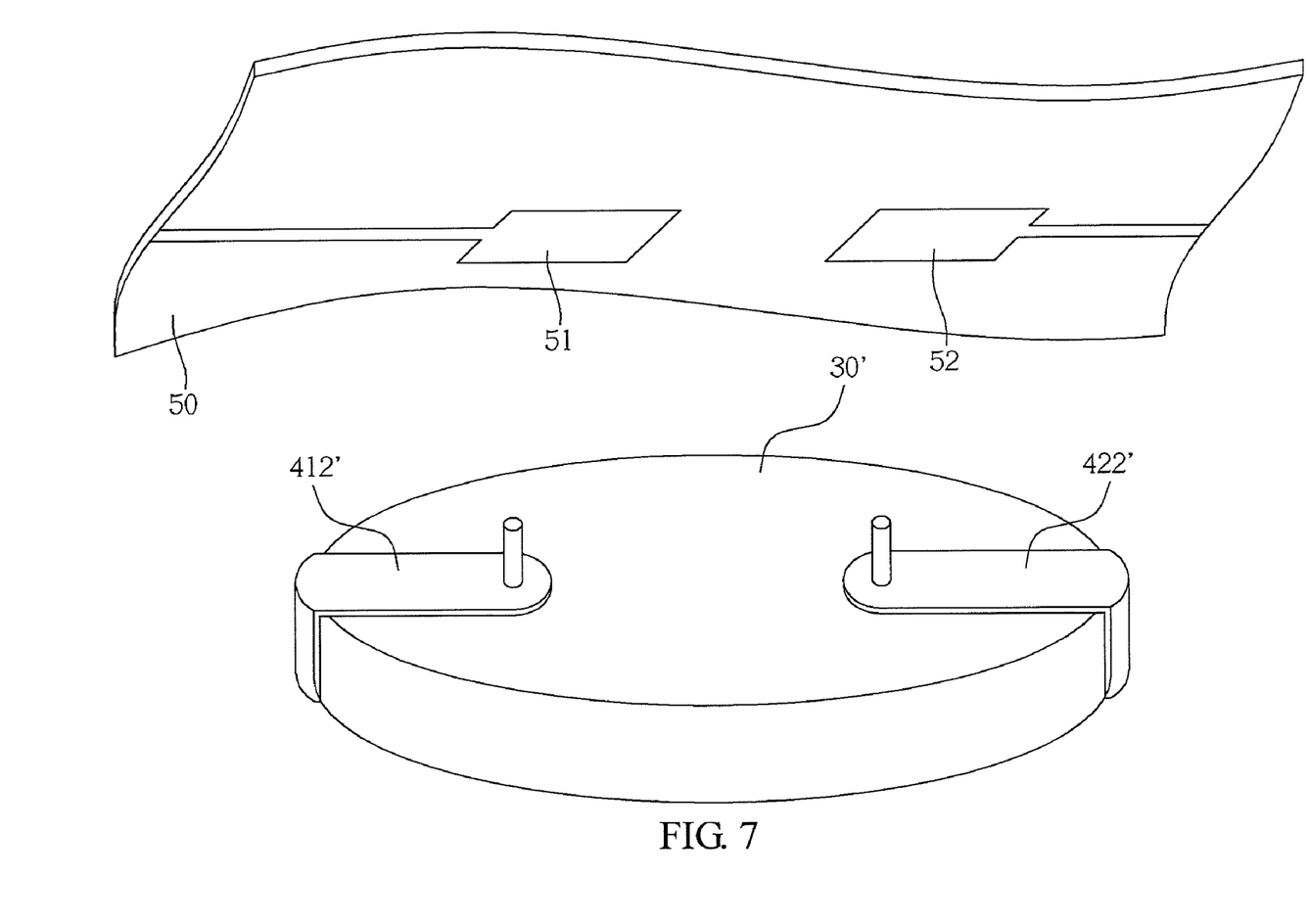
FIG. 7 is a schematic diagram showing a seat of a capacitor according to a second embodiment of the invention.

FIG. 6 and FIG. 7 are schematic diagrams showing that the capacitor seat 30 and the capacitor seat 30' and the conductors are installed on the PCB in different ways. In FIG. 6, the second ends 412 and 422 of the conductors 41 and 42 on the bottom of the capacitor seat 30 may be soldered on the electrical contacts 51 and 52 of the PCB 50 in the form of dual in-line package (DIP) leads, respectively. In FIG. 7, the second ends 412' and 422' of the conductors on the bottom of the capacitor seat 30' may be soldered on the electrical contacts 51 and 52 of the PCB 50 using the surface mounting device (SMD) technology, respectively.

The positive and negative polarities leads of the conventional capacitor are directly soldered on the electrical contacts of the PCB, and thus the capacitor is not easily replaced when the capacitor has errors or is damaged in use, or a user wants to replace it with a different type of the capacitor 20 to test or adjust the characteristic of the circuit. Furthermore, the conventional capacitor easily leans due to the mis-touch, or even the lead of the capacitor is broken, and the capacitor has errors. The detachable capacitor device according to the invention utilizes the capacitor seat and the two conductors to install the capacitor seat on the PCB by soldering the two conductors on the electrical contacts of the PCB. The capacitor is installed on the capacitor seat by detachably pressing, rotating the two polarity leads of the capacitor or in other feasible fastening ways to be electrically connected with the electrical contacts of the PCB. If the detachable capacitor device has errors or is damaged in use, or a user wants to replace it with a different type of the capacitor 20 to test or adjust the characteristic of the circuit, it is easy to replace the capacitor.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A detachable capacitor device, used for being installed on a printed circuit board (PCB), the detachable capacitor device comprising:
   a capacitor having a first lead and a second lead;
   a capacitor seat having a first recess and a second recess; and
   two conductors disposed in the first recess and the second recess and electrically connected with electrical contacts of the PCB, respectively;
   wherein the two conductors are U-shaped metal sheets held in the first recess and the second recess, respectively, each of the two conductors has a first end and a second end, the first ends are electrically connected with the electrical contacts of the PCB, respectively, and when the capacitor is installed on the capacitor seat, the second ends are electrically connected with the first lead and the second lead, respectively.

2. The capacitor device according to claim 1, wherein each of the first lead and the second lead of the capacitor has a turning portion, and the capacitor is electrically connected with the two conductors via the turning portions.

3. The capacitor device according to claim 1, wherein the first lead and the second lead of the capacitor are flat leads with different widths.

4. The capacitor device according to claim 3, wherein the first recess and the second recess of the capacitor seat have different widths corresponding to the widths of the first lead and the second lead, respectively.

5. The capacitor device according to claim 3, wherein the width of the second lead is bigger than the width of the first lead, and the width of one of the first recess and the second recess is smaller than the width of the second lead and not smaller than the width of the first lead.

6. The capacitor device according to claim 1, wherein the first recess and the second recess of the capacitor seat are L-shaped recesses.

7. The capacitor device according to claim 1, wherein the first lead and the second lead of the capacitor are needle-shaped leads.

8. The capacitor device according to claim 7, wherein the lengths of the first lead and the second lead of the capacitor are different.

9. The capacitor device according to claim 1, wherein the two conductors are electrically connected with the electrical contacts of the PCB using the soldering technology, respectively.

10. The capacitor device according to claim 9, wherein the two conductors are electrically connected with the electrical contacts of the PCB using the dual in-line package (DIP) technology.

11. The capacitor device according to claim 9, wherein the two conductors are electrically connected with the electrical contacts of the PCB using the surface mounting device (SMD) technology.

* * * * *